(12) United States Patent
Benner et al.

(10) Patent No.: US 7,544,527 B2
(45) Date of Patent: Jun. 9, 2009

(54) METHOD AND APPARATUS FOR PROVIDING OPTOELECTRONIC COMMUNICATION WITH AN ELECTRONIC DEVICE

(75) Inventors: Alan F. Benner, Poughkeepsie, NY (US); How Tzu Lin, Vestal, NY (US); Frank L. Pompeo, Redding, CT (US); Subhash L. Shinde, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 11/279,276

(22) Filed: Apr. 11, 2006

(65) Prior Publication Data

US 2006/0182397 A1    Aug. 17, 2006

Related U.S. Application Data

(62) Division of application No. 10/757,206, filed on Jan. 14, 2004, now Pat. No. 7,084,496.

(51) Int. Cl.
| | |
|---|---|
| H01L 21/00 | (2006.01) |
| G02B 6/12 | (2006.01) |
| G02B 6/30 | (2006.01) |
| G02B 6/36 | (2006.01) |
| G02B 6/04 | (2006.01) |

(52) U.S. Cl. .......................... 438/29; 438/69; 438/122; 438/106; 385/14; 385/49; 385/68; 385/69; 385/115

(58) Field of Classification Search ............... 385/14, 385/49, 88–94, 115, 730; 438/29, 69, 106, 438/122
See application file for complete search history.

(56) References Cited

U.S. PATENT DOCUMENTS

| 4,558,171 | A | | 12/1985 | Gantly et al. |
|---|---|---|---|---|
| 4,914,551 | A | * | 4/1990 | Anschel et al. ............. 361/714 |
| 5,198,684 | A | * | 3/1993 | Sudo .......................... 257/79 |
| 5,200,631 | A | | 4/1993 | Austin et al. |
| 5,237,434 | A | | 8/1993 | Feldman et al. |
| 5,600,741 | A | | 2/1997 | Hauer et al. |
| 5,625,734 | A | * | 4/1997 | Thomas et al. ................. 385/88 |
| 5,905,272 | A | | 5/1999 | Moise |
| 6,034,429 | A | | 3/2000 | Glenn et al. |
| 6,203,212 | B1 | * | 3/2001 | Rosenberg et al. ............ 385/92 |
| 6,205,264 | B1 | * | 3/2001 | Jin et al. ....................... 385/14 |
| 6,274,391 | B1 | | 8/2001 | Wachtler et al. |
| 6,318,909 | B1 | * | 11/2001 | Giboney et al. ............... 385/90 |

(Continued)

Primary Examiner—Ha Tran T Nguyen
Assistant Examiner—Karen M Kusumakar
(74) Attorney, Agent, or Firm—Cantor Colburn LLP; Arthur Ortega (57) ABSTRACT

An optoelectronic assembly for an electronic system includes a thermally conductive, metallized transparent substrate having a first surface and an opposite second surface. A support chip set is bonded to the transparent substrate. A first substrate is in communication with the transparent substrate via the second surface and support chip set therebetween. A second substrate is in communication with the second surface of the first substrate and is configured for mounting at least one of data processing, data switching and data storage chips. An optoelectronic transducer is in signal communication with the support chip set, and an optical signaling medium having one end with an optical fiber array aligned with the transducer is substantially normal to the first surface of the transparent substrate. The support chip set and the transducer share a common thermal path for cooling.

3 Claims, 5 Drawing Sheets

U.S. PATENT DOCUMENTS

| | | |
|---|---|---|
| 6,424,020 B1 | 7/2002 | Vu et al. |
| 6,515,334 B2 | 2/2003 | Yamazaki et al. |
| 6,517,258 B1 * | 2/2003 | Keska et al. ................... 385/92 |
| 6,676,302 B2 * | 1/2004 | Cheng et al. ................... 385/88 |
| 6,696,755 B2 | 2/2004 | Kami et al. |
| 6,767,141 B1 * | 7/2004 | Dudek et al. ................... 385/92 |
| 6,955,481 B2 | 10/2005 | Colgan et al. |
| 2001/0023970 A1 | 9/2001 | Iida et al. |
| 2002/0176168 A1 | 11/2002 | Choi et al. |
| 2002/0197024 A1 * | 12/2002 | O'Connor et al. ............. 385/89 |
| 2003/0007717 A1 * | 1/2003 | Chiappetta et al. ............ 385/14 |
| 2003/0048992 A1 | 3/2003 | Lundqvist |
| 2003/0142913 A1 | 7/2003 | Li |

* cited by examiner

METHOD AND APPARATUS FOR PROVIDING OPTOELECTRONIC COMMUNICATION WITH AN ELECTRONIC DEVICE

CROSS-REFERENCE TO RELATED APPLICATIONS

This application is a divisional of U.S. patent application Ser. No. 10/757,206 filed Jan. 14, 2004, the contents of which are incorporated by reference herein in their entirety.

BACKGROUND OF THE INVENTION

The present disclosure relates generally to optoelectronic communication with an electronic device, and particularly to the interconnection and attachment arrangement for providing optoelectronic communication between an electronic chip on a first level package and a high density optical transceiver.

Typically, optoelectronic transceivers are mounted on a second level package, such as a printed circuit board, and are provided with their own heat sink and a means of being electrically interconnected with a printed circuit board, such as via a socket or a solder Ball Grid Array (BGA). The typical pitch of the electrical connections in a BGA is approximately 1.27 mm, although some products use finer pitches such as 1.0 or 0.8 mm. The size of an optoelectronic transceiver is largely determined by the area required by the heat sink and/or the area required for electrical connections between the optoelectronic transceiver and the second level package.

The trend in the computer industry regarding large servers is to utilize multiple processor groups, each group containing multiple processors on a first level package, such as a Multi-Chip Module (MCM), which must be interconnected with very high speed data buses to enable the totality of processors to act in unison, otherwise referred to as symmetric multi-processing (SMP) configuration. The first level package provides dense electrical interconnection between the multiple processor chip(s), each of which may contain multiple processor cores, and cache memory chip(s), which may also be mounted on the MCM or other first level package. To connect between multiple MCMs, copper interconnect technology has been used as the interconnect medium, but is limited in its ability to scale to the bandwidth/distance requirements of next generation servers. These limitations are primarily associated with the signal loss and distortion in the electrical transport media, such as printed circuit boards and connectors for example, and bandwidth reduction due to skin effect at high data transmission rates. To overcome some of these limitations, optical interconnection, which does not have the copper limitations and can operate at speeds sufficient to satisfy future generation server interconnection requirements, is becoming the interconnection technology of choice.

There have been a number of proposed inventions for integrating optical transceivers into modules, but they have had varying drawbacks for practicality and utility in computing systems. In one example, a flex circuit is used to connect a 2-dimensional (2-D) dense transceiver to the transceiver. While this solution appears to be quite practical and useful for a variety of applications, the electrical signals going to and from the transceiver must traverse a path of roughly 2-3 cm through the flex circuit. This drawback will limit (a) the maximum possible number of signal channels, due to the 1-dimensional nature of the electrical signal path array from CMOS to O/E devices, and (b) the bandwidth per signal path. In addition, the non-planarity of this package will make the assembly somewhat difficult.

Moreover, since the n×n laser arrays typically emit light perpendicular to the surface of the device, the optical interconnection and heat removal approaches are many times at odds with each other for these devices. Since each of these functions requires a full 2-dimensional surface, to operate most effectively, an ideal packaging technology would have 3 surfaces, which is difficult, for planar devices.

Accordingly, there is a need in the art to provide an improved apparatus and method for providing optoelectronic communication with electronic chips, and particularly with electronic chips on a first level package such as MCMs in large high speed servers using materials and packaging that closely integrate electrical, optical, and thermal heat flow management, while preserving full 2-dimensional capability for electrical, optical and thermal flow.

SUMMARY OF THE INVENTION

In one embodiment, an optoelectronic assembly for an electronic system includes a transparent substrate having a first surface and an opposite second surface, the transparent substrate being thermally conductive and being metallized on the first surface. A support electronic chip set is configured for at least one of providing multiplexing, demultiplexing, coding, decoding and optoelectronic transducer driving and receive functions and is bonded to the second surface of the transparent substrate. A first substrate having a first surface and an opposite second surface, is in communication with the transparent substrate via the metallized second surface and support chip set therebetween. A second substrate is in communication with the second surface of the first substrate and is configured for mounting at least one of data processing, data switching and data storage chips. An optoelectronic transducer is in signal communication with the support electronic chip set; and an optical signaling medium defined with one end having an optical fiber array aligned with the optoelectronic transducer is substantially normal to the first surface of the transparent substrate, wherein an electrical signal from the support electronic chip set is communicated to the optoelectronic transducer via the metallized second surface of the transparent substrate, and wherein the support electronic chip set and the optoelectronic transducer share a common thermal path for cooling.

In another embodiment, an optoelectronic assembly for an electronic system includes a support electronic chip set configured for at least one of providing multiplexing, demultiplexing, coding, decoding and optoelectronic transducer driving and receiving functions; a transparent substrate having a first and second surface, the first surface configured as a first planar surface to thermally couple with a heat sink while the second surface is in communication with a optoelectronic transducer; a first substrate having a first surface and an opposite second surface, the first surface in combination with a transparent substrate carrier providing an electrical signaling medium with and between the support electronic chip set and the optoelectronic transducer in signal communication with the support electronic chip set; a second substrate in communication with the second surface of the first substrate, the second substrate configured for directly mounting at least one of data processing, data switching and data storage chips; and an optical signaling medium defined with one end having an optical fiber array aligned with the optoelectronic transducer substantially normal to the first surface of the transparent substrate, wherein the electronic chip set and the optoelectronic transducer share a common thermal path for cooling through the transparent substrate.

In yet another embodiment, a method of fabricating an optoelectronic assembly for communicating a signal from a system electronic chip set on an MCM, the system electronic chip set adapted for at least one of data processing, data switching, and data storage, to another component in a computer system, is disclosed. The method includes etching wells configured to mount an optoelectronic transducer and a support electronic chip set on a first surface of a chip carrier; metallizing a first surface of a transparent substrate as an electrical signaling medium between the support electronic chip set and the optoelectronic transducer on the combination of the transparent substrate and the chip carrier for electrical interconnection thereof; where the support electronic chip set is configured for at least one of providing multiplexing, demultiplexing, coding, decoding and optoelectronic transducer driving and receiving functions; bonding the support electronic chip set and optoelectronic transducer to the chip carrier; interconnecting electrically the support electronic chip set to the optoelectronic transducer via the metallized transparent substrate; attaching the chip carrier to a second substrate; attaching a heat sink to a second surface opposite the first surface of the transparent substrate, the heat sink configured with a connector receptacle configured to receive a fiber array connector therein and provide optical communication through the second surface to the optoelectronic transducer; and bonding a fiber array disposed in the fiber array connector to the transparent substrate optically aligned with the optoelectronic transducer to provide an optical signaling medium to the optoelectronic transducer, wherein the electronic chip set and the optoelectronic transducer share a common thermal path for cooling thereof.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the present invention provides an optoelectronic assembly for a computer system having a signal communication path between an electronic computer or signal processing chip and an optoelectronic transducer that bypasses a printed circuit board, thereby providing high speed communication from the electronic chip to other components in the computer system. Another embodiment provides a high density optical signal path by using multiple optoelectronic transducers, alternatively referred to as a high density optical transceiver (HDOT). While embodiments described herein depict the interconnection of a processor complex within a Multi-Chip Module (MCM) to other processor complexes having an exemplary optoelectronic signal path, it will be appreciated that the disclosed invention is also applicable to the interconnection of other electronic devices housed in MCMs or SCMs (Single Chip Module), or other types of first level packaging. For example, embodiments of the invention may be employed for interconnecting the core switches within a large-scale Internet switch, or router, with the network processors in the router's line cards. Similarly, other electronic systems requiring dense interconnection of electronic chips mounted on MCMs or SCMs or other types of first level packaging at a high aggregate bandwidth over distances of 0.2 meters (m) or greater may benefit from embodiments of the invention.

Figure 1:
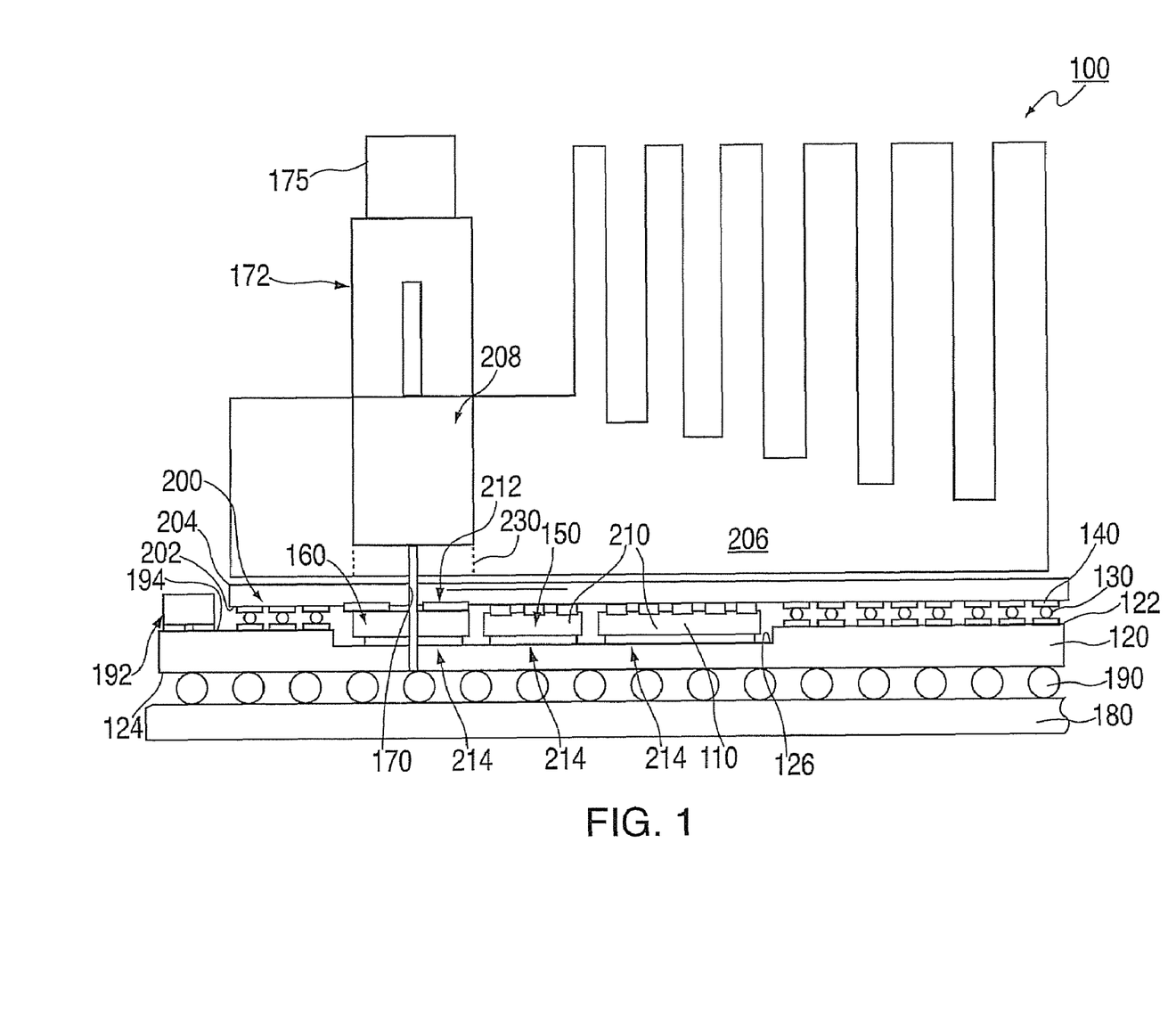
FIG. 1 depicts a partial cross section view of an exemplary optoelectronic assembly in accordance with an embodiment of the invention.

Referring now to FIG. 1, a partial cross section view of an optoelectronic assembly 100 for a computer system is depicted having an electronic chip or chips 110 (alternatively referred to as a chip set), a substrate (alternatively referred to as a first level package) 120 having a first surface 122 in signal communication with electronic chip 110 via a suitable electrical connection 130 (such as C4 micro solder ball interconnect technology, for example), an electrical circuit metallization layer 140 in signal communication with substrate 120 via electrical connection 130, an optoelectronic transducer (O/E) 160 in signal communication with a driver or receiver chip 150 via metallization layer 140, and optical coupling guides 170 (such as alignment pins for an MT ferrule 172, or other pluggable optical connector ferrule, for example) for aligning optoelectronic transducer 160 with an optical circuit 175, such as a fiber optic cable or bundle, for example. Also depicted in FIG. 1 is a printed circuit board (alternatively referred to as a second level package or second substrate) 180 in signal communication with a second surface 124 of substrate 120 via a suitable connection 190 (such as column or ball-grid-array connections, ceramic-ball-grid-array (CBGA) or land grid array (LGA), for example), for providing power and communicating signals to and from electronic chip 110 and substrate 120 from and to other components of the computer system. This connection 190 could also include a pluggable high-speed electrical connector, in order that the optoelectronic assembly 100 could be removed from the second substrate (MCM or FR4 circuit board) 180. However, in accordance with an embodiment of the invention, electrical signals to and from electronic chip 110 may also be communicated from and to optoelectronic transducer 160 via substrate 120 and directly to metallization layer 140, thereby bypassing printed circuit board 180. A decoupling capacitor 192, for example, or other passive device may be electrically coupled to substrate 120 via another metallization layer 194 opposing metallization layer 140. First surface 122 of substrate 120 is further defined by a cavity surface 126, which will be discussed herein below. While reference is made herein to signal communication from electronic chip 110 to optoelectronic transducer 160, it will be appreciated that the signal flow is bi-directional, where optoelectronic transducer 160 converts the outbound electrical data signals generated from electronic chip 110 into optical signals (e/o conversion), and inbound optical data signals into electrical signals (o/e conversion).

Further depicted in FIG. 1 is an exemplary transparent substrate 200 (alternatively referred to as a superstrate) having first and second surfaces 202, 204, where first surface 202 is in thermal contact, or communication, with electronic chips 110, driver or receiver 150 and optoelectronic transducer 160 to effect cooling thereof, and second surface 204 is in thermal contact, or communication, with a heat sink 206 to effect cooling thereof while providing a transparent medium for optical signal communication between MT ferrule 172 and optoelectronic transducer 160. Heat sink 206 includes a receptacle 208 configured to receive MT ferrule 172. MT ferrule 172 is preferably thermo-compression bonded in receptacle 208 or is bonded therein using a transparent conductive glue generally shown at 212. MT ferrule 172 may be permanently attached on, with thermo-compression bonding or glue (the glue doesn't need to be transparent—it may just bind around the edges of the ferrule, and not be in the optical path). However, it is preferable that MT ferrule 172 will be a removable or pluggable, so that the optical fibers can be separated from the optoelectronic assembly. As used herein, the term thermal contact refers to an arrangement that provides good thermal communication from one surface to another and does not necessarily denote the absence of an intermediate layer, such as an adhesive or a filler for example. For example, chips 110, 150 and 160 are bonded to cavity surface 126 using a thermally conductive paste generally indicated at 214. The thermal communication between optoelectronic transducer 160 and second surface 204 of transparent substrate 200 may be direct or via a thermal spreader, discussed below. Heat sink 206 is preferably an air cooled finned heat sink or water cooler modular refrigeration unit (not shown), or other means of removing heat that may be attached to the top surface of the transparent substrate 200 to further effect heat transfer. The transparent substrate 200 provides the primary thermal path for heat flow from both the electronic chip or chips 110 and the optoelectronic transducer(s) 160 to the heat sink 206 or other means used to cool the system. Optoelectronic assembly 100 may include a seal (not shown) between substrate 120 and transparent substrate 200 that traverses the perimeter of substrate 120, thereby providing protection to electronic chip or chips 110 from ambient contaminants.

In an exemplary embodiment, transparent substrate 200 is transparent aluminum nitride (t-AlN). Transparent aluminum nitride is a commercially available, high thermal conductive material (e.g., about 190 W/mK) having transparency to commercially available lasers used in optoelectronics. Further, t-AlN has a coefficient of thermal expansion similar to that of silicon (e.g., about 4.5 ppm). Since polycrystalline AlN can be metallized, t-AlN is metallized to form metallization layer 140 thereon. In an alternative embodiment, sapphire provides lower thermal conductivity, but better transparency compared with t-AlN. Use of either t-AlN or sapphire in the package described above closely integrates electrical, optical, and thermal heat flow management preserving full two-dimensional (2-D) capability for each flow.

Optoelectronic transducer 160 may include a support IC (integrated circuit) 210 that may be integrally arranged with optoelectronic transducer 160. Support IC 210 is electrically connected between electrical circuit 140 and optoelectronic transducer 160 for communicating the electrical signals therebetween. In an embodiment, optoelectronic transducer 160 includes a laser, a vertical cavity surface emitting laser (VCSEL), a light emitting diode, or a photodiode (PD) array, in signal communication with support IC 210 for receiving an electrical signal therefrom and for generating an optical signal in response thereto or for receiving a light signal and for generating an electrical signal in response thereto. The output of optoelectronic transducer 160 is a light signal for outbound transmission that is aligned with and communicated to optical circuit 175 for subsequent signal communication, and an electrical signal for inbound transmission upon receipt of a light signal from optical circuit 175, as discussed above.

Electronic chip 110 may be a processor chip, a memory chip, a signal processing chip or any combination thereof or multiple combinations thereof, and substrate 120 may be a multi-chip module (MCM), a dual-chip module (DCM), a single-chip module (SCM), or any other type of first level package substrate, or any combination thereof. Substrate 120 may also be manufactured from a ceramic or an organic material. In an exemplary embodiment, electrical circuit 140 is a metallization layer formed on the first surface 202 of transparent substrate 200, having many high speed lines within a single or several planes within the metallization layer.

Figure 2:
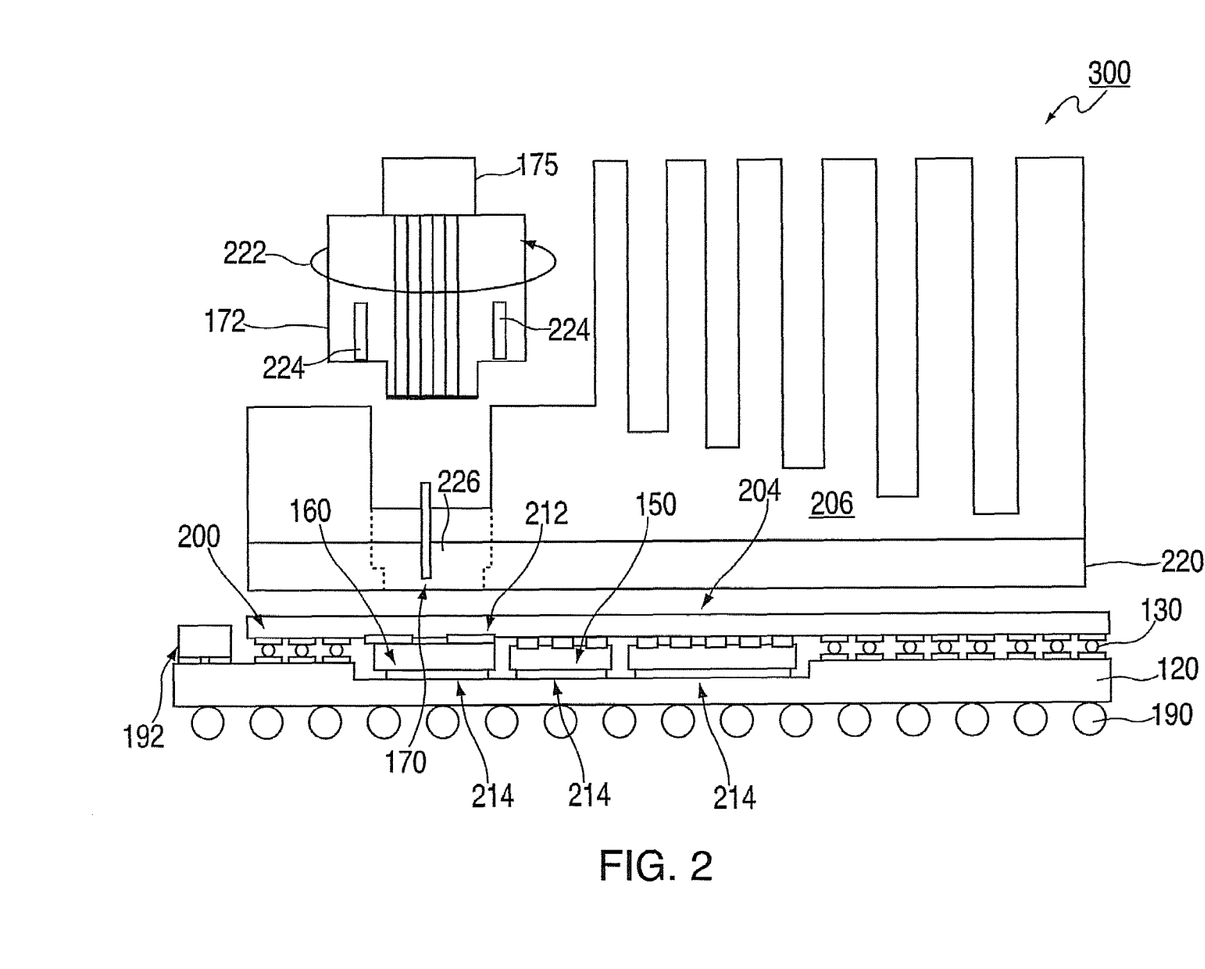
FIG. 2 depicts an alternative arrangement to that depicted in FIG. 1.

In an alternative embodiment of an optoelectronic assembly 300, and referring now to FIG. 2, a further degree of heat-spreading is provided via a substrate 220 employed as a heat spreader disposed intermediate heat sink 206 and transparent substrate 200. In an exemplary alternative embodiment, for example, substrate 220 is a SiC substrate 220 can be integrated in the package assembly 100 illustrated with respect to FIG. 1. The heat spreader preferably includes a coefficient of thermal expansion (CTE) substantially matched to Si, therefore, choices include SiC, AlN, or sintered Diamond with a substantially matched CTE, for example. SiC substrate 220 preferably includes mechanical mounting pins (not shown) for properly aligning heat sink 206 with transparent substrate 200 to insure optical alignment between optoelectronic transducer 160 and MT ferrule 172.

It will be recognized that MT ferrule 172 is rotated about 90 degrees indicated at 222 illustrating two receptacles 224 configured to receive a corresponding MT connector alignment pin 170. In an exemplary embodiment, the optical connector ferrule 172 is a MT connector ferrule with 72 extended optical fibers operably coupled to a 6×12 fiber cable (e.g., 6 twelve-fiber ribbons). It will be recognized that the figure shows an MT ferrule 172 rotated about 90 degrees indicated at 222 illustrating two receptacles 224 each configured to receive a corresponding MT connector alignment pin. The optical connector ferrule may alternatively be a modified MT ferrule, with more or fewer optical fibers, or may be another optical connector ferrule, with a different mechanism for assuring optical alignment of optical fibers with the optoelectronic transducer 160. It will also be recognized by one skilled in the pertinent art that SiC substrate 220 is configured with an aperture 226 therethrough shown with phantom lines to maintain optical communication between the fibers extending from MT ferrule 172 and optoelectronic transducer 160. The fibers extending from MT ferrule 172 extend transverse to a plane defining the surface 204 (shown in FIG. 1) of transparent substrate 200 to maintain 2-D flow of optical signals while maintaining 2-D flow management of electrical signaling therebetween and thermal dissipation therefrom.

In an exemplary embodiment and referring to FIG. 1, the optoelectronic assembly 100 is a high density optical transceiver (HDOT) with high density C4 pads 190 such that the module or assembly 100 can reside on the same substrate as the processor chips of the MCM. This arrangement yields a high speed interconnect capability (scale with processor speeds since all interconnects are on the MCM 180 and there is no need for electrical signals to go to a PC board through a Land Grid Array (LGA) or other electrical connector. The electrical signals from, or to, the processors are received, or sent, through ceramic or organic chip carrier substrate 120 and are carried to, or from, the Mux/Code, or Demux/Decode, chip 110 disposed on a bottom surface 202 of substrate 120 using standard via technology. It will be noted that substrate 120 may also include an organic or other suitable material and is not limited to a ceramic carrier. The Multiplexer/Coder, or Demux/Decode, chips 110 are C4 attached to substrate 120. A cutout 230 is configured in heat sink 206 to allow room for MT connector 172. Connection from the Mux/Code, or Demux/Decoder, chip 110 to the driver, or receiver chip, 150 and to connection to the VCSEL, or photodiode, array 160 is via lines in the metallization layer 140 disposed on substrate 200. The mating of the connector 172 is directed from viewing, through a microscope (not shown), from above assembly 100 and bonding in place with a suitable bonding agent discussed above.

Figure 3:
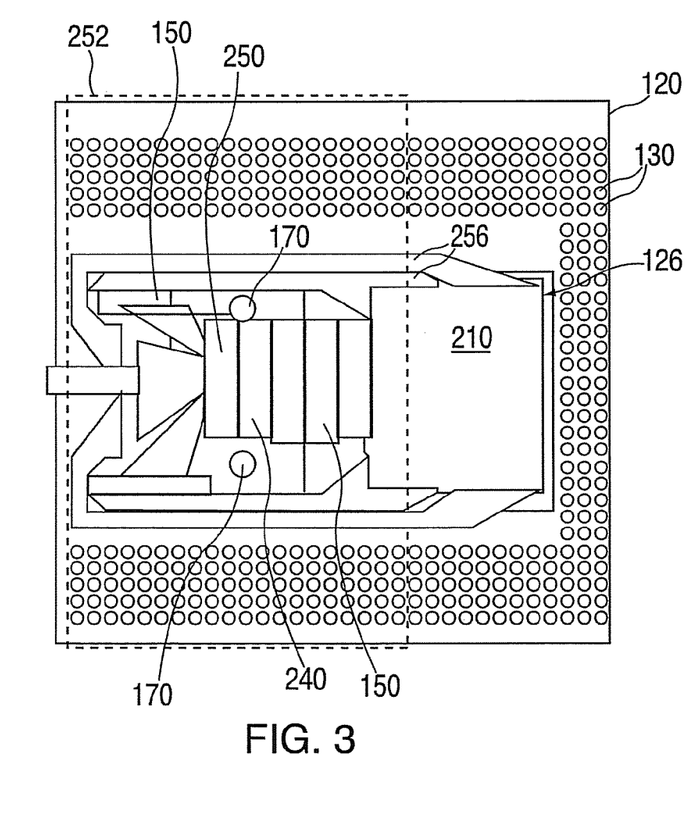
FIG. 3 depicts a top view of the exemplary optoelectronic assembly depicted in FIG. 1 with a heat sink and transparent substrate removed therefrom illustrating a transmit section and a receiver section.
Figure 4:
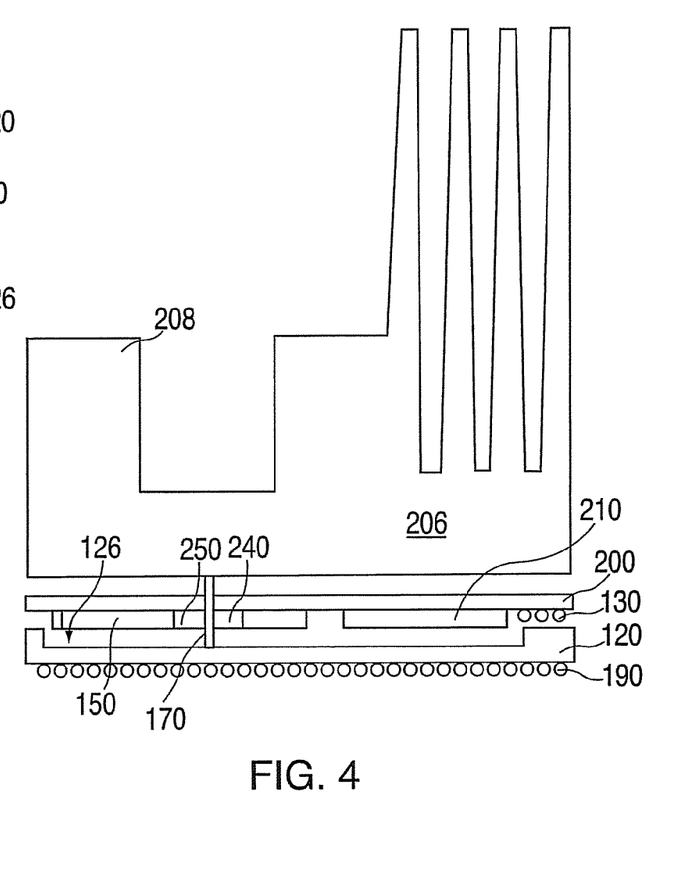
FIG. 4 depicts an elevational view of the exemplary optoelectronic assembly of FIG. 3 in scale including the heat sink and transparent substrate.

Referring to FIG. 3, an exemplary embodiment of a HDOT assembly 100 includes a transmit section having 36 trench photo diodes 240 and a receiver section having 36 VCELS 250 which are packaged substantially the same except the transmit section 240 does the e/o conversion and the receiver section 250 does the o/e conversion. FIG. 3 also illustrates the size of an MTP connector shell indicated with phantom line 252. Connector shell 252 houses 72 optical fibers in a 6×12 array defined by two outboard guides (not shown) aligned with corresponding pins 170. It will also be recognized that a plurality of C4s 130 are serially aligned on three peripheral sides defining section 240 and 250 to provide mechanical strength for supporting the attachment of the transparent substrate 200 to substrate 120 (FIG. 1) as well as providing electrical communication therebetween. Further it is recognized that wiring generally shown at 256 is arranged to provide communication between electronic chip set 210 and sections 240 and 250. In an exemplary embodiment, wiring 256 corresponds to metallization layer 140 on transparent substrate 200 (FIG. 1). As an alternative, separate transmit and receive modules can be made if desired. FIG. 4 illustrates FIG. 3 in an elevational view in scale including transparent substrate 200 and heat sink 206 aligned therewith.

As discussed above, all embodiments depicted in FIGS. 1-4 show an electrical signal path passing from electronic chip or chips 110 to substrate 200, and then to optoelectronic transducer 160, with the signal path bypassing printed circuit board 180. Also, there is a common primary thermal path for the electronic chip(s) 110 and the optoelectronic transducer(s) 160 where they share a thermal hat or transparent substrate 200 onto which heat sink 206 or other heat removing device is attached.

During the operation of optoelectronic assembly 100, where a signal from electronic chip 110 is communicated to another component in the computer system, the electrical signal, initiated at electronic chip 110 and communicated to metallization layer 140, is directly communicated from metallization layer 140 to the optoelectronic transducer 160 via metallization layer 140, thereby bypassing printed circuit board 180. The signal at optoelectronic transducer 160 is converted from an electrical signal to an optical signal, after which the optical signal is communicated to an optical circuit 175 (such as a m×n fiber optic bundle, for example) for communication to another component in the computer system. During this operation, heat generated at electronic chip 110 is transferred across first surface 202 at transparent substrate 200 and away from electronic chip 110. Also, heat generated at optoelectronic transducer 160 is transferred across second surface 204 of transparent substrate 200 and away from optoelectronic transducer 160 while first surface 202 also provides a 2-D optical transmission path.

Figure 5:
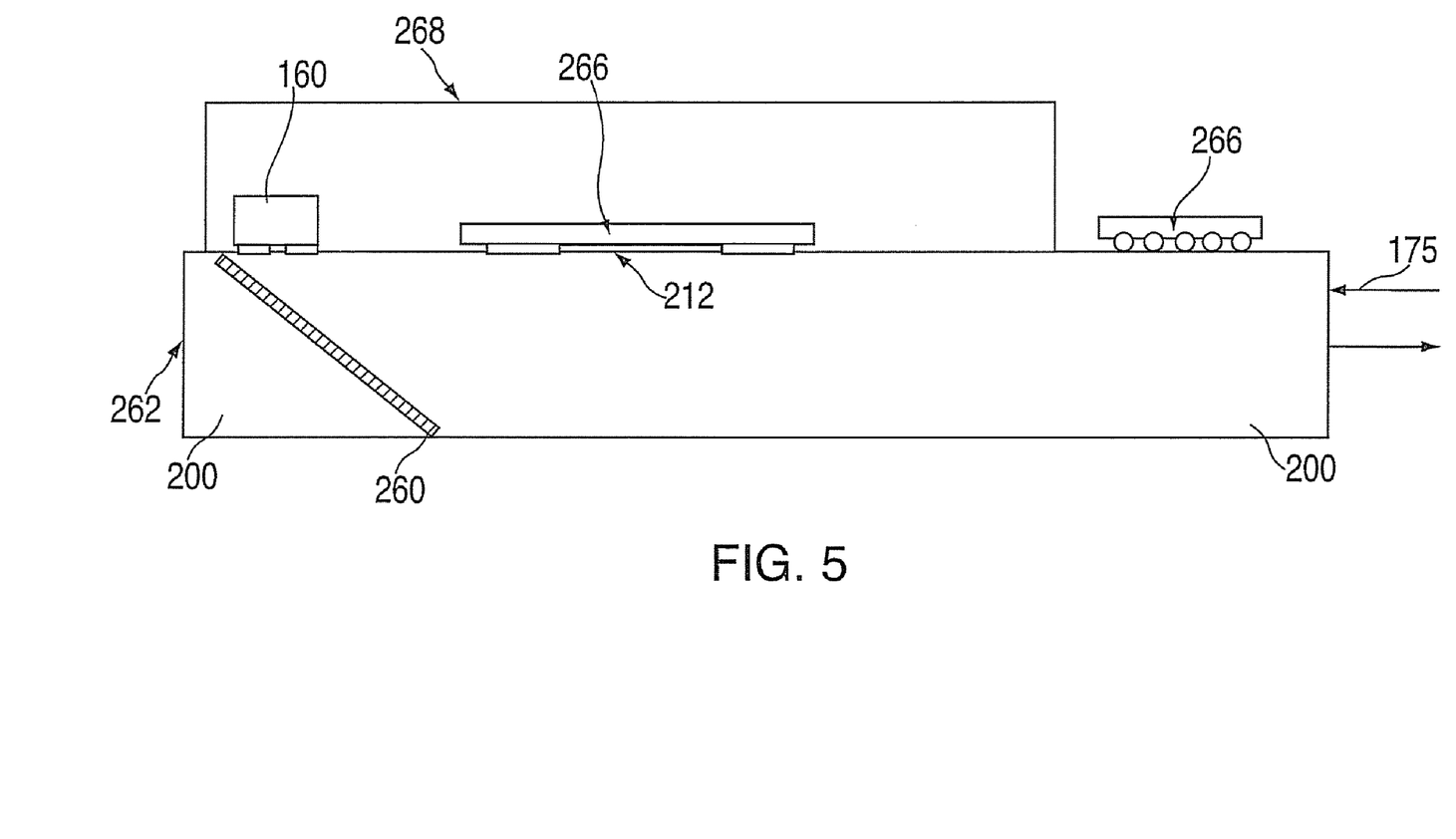
FIG. 5 depicts a partial cross sectional view of an alternative exemplary embodiment of an optoelectronic assembly having a transparent substrate used as an optical signaling medium.

Referring now to FIG. 5, an optical I/O to and from the optical transducer 160 (i.e., either VCSEL or photodiode) is illustrated using transparent substrate 200 in an alternative embodiment. The optical I/O transmission path is from optical circuit 175 to the optical transducer 160 is done with a 45 degree metallized mirror 260 disposed in transparent substrate 200 as shown in FIG. 5. The light signal exits the VCSEL 160 vertically in a downward direction as illustrated and is directed transversely through transparent substrate 200 by the 45 metallized degree mirror 260. In the case of a photodiode 160, the light signal from optical circuit 175 is directed vertically upward as illustrated into the photodiode 160. The VCSEL or photodiode 160 is bonded to transparent substrate 200 using transparent conductive glue generally shown at 212, or alternatively, bonded with thermocompression bonding. Furthermore, a surface defining transparent substrate 200 is metallized generally indicated at 262, in this manner, a need for a waveguide is alleviated and an optical signaly medium is defined. Furthermore, metallized surface 262 allows passive devices and other chips generally shown at 266 to be coupled thereto. A hermetic cover 268 may be employed to hermetically seal VCSEL or photo diode chip 160 and any other chip 266 using AIN or Kovar.

Figure 6:
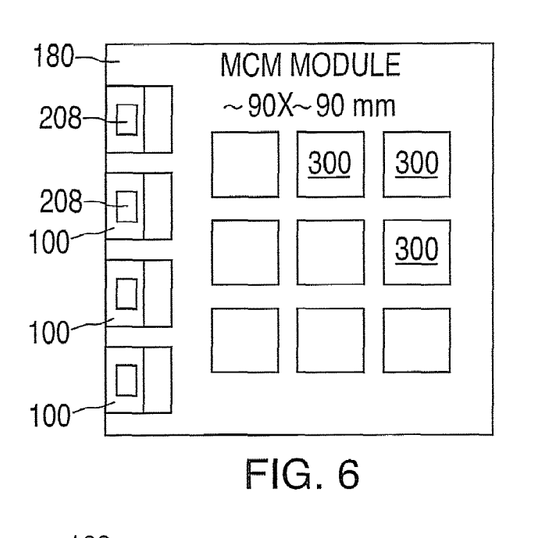
FIG. 6 depicts a top view of four optoelectronic assemblies each configured to be coupled to a multi-chip module (MCM) using 72 optical fibers.
Figure 7:
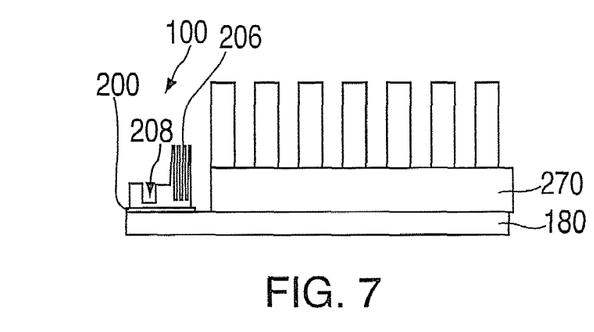
FIG. 7 depicts a side elevational view to that of FIG. 6.

Referring now to FIGS. 6 and 7, where FIG. 6 depicts a top view of an MCM with the HDOT 100 outside the MCM cover 270 but on the substrate 180. FIG. 7 depicts an orthogonal side view of FIG. 6, optoelectronic assembly 100 is now depicted having first and second HDOTs 100 in communication with MCM 180 via first and second C4s 190 (FIG. 1) or micro BGA solder balls. With multiple O/E devices, multiple electrical signals and multiple optical signals may be transmitted at the same time in parallel. Each HDOT 100 is configured to receive six 12 fiber arrays in receptacle extending normal to a surface defining MCM 180 and in operable communication with MCM 180. The construction of the HDOT 100 allows the HDOT to be treated just like any other processor chip from a packaging viewpoint and will scale with the silicon and fiber optic technology. For example, the arrangement illustrated with respect to FIGS. 1-5 can yield as many as 288 fibers (e.g., 4 HDOTs each having six twelve fiber arrays) along a MCM having a length L of about 90 mm. This is equivalent to 2304 electrical signals using an 8× multiplexer 110 when going from electrical to optical signaling. An MCM cover 270 (FIG. 7) is disposed over multiple processors 300 disposed on MCM 180 (nine shown in FIG. 6).

Figure 8:
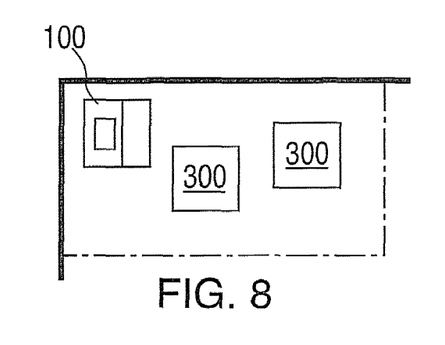
FIG. 8 depicts one of the optoelectronic assemblies of FIG. 6 for use in a card mounted application.
Figure 9:
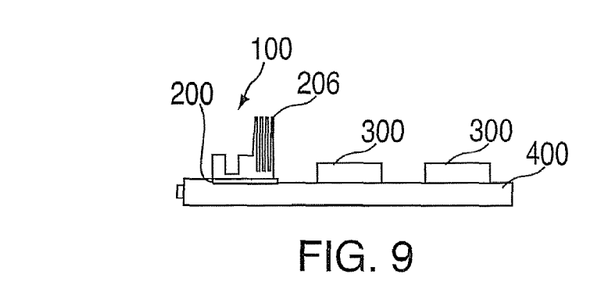
FIG. 9 depicts a side elevational view to that of FIG. 8.
Figure 10:
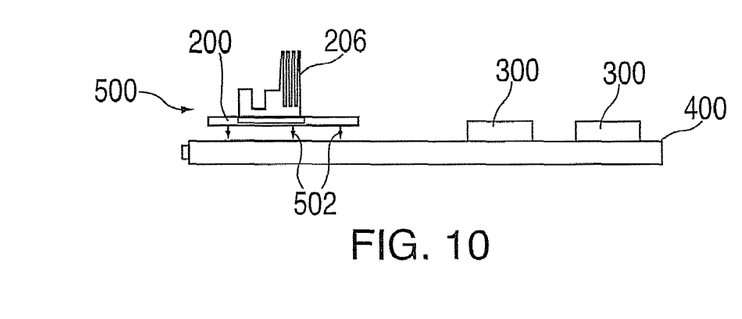
FIG. 10 depicts one of the optoelectronic assemblies of FIG. 6 attached to a mini card before being used in a card mounted application.

In alternative embodiments, it will be recognized by one skilled in the pertinent art that assembly 100 may be card mounted or industry pluggable. More specifically with reference to FIGS. 8 and 9, when assembly 100 is card mounted for example, a 0.5 mm BGA I/O (not shown) allows direct mounting of assembly 100 to a FR4 circuit board 400. Assembly 100 mounts either in a middle portion or edge portion defining the card because of the vertical fiber escape from assembly 100. When assembly 100 is employed as an industry pluggable device referring now to FIG. 10, assembly 100 is BGA attached to mini cards shown generally at 500, winch attach to a main FR4 circuit board using a 1 mm BGA or Berg-type socket connector generally indicated at 502.

During the operation of optoelectronic assembly 100, where a signal from electronic chip 110 is communicated to another component in the computer system, the electrical signal, initiated at electronic chip 110 and communicated to substrate 120 via metallization layer 140, is directly communicated from substrate 120 to chip 300 via electrical interconnection with MCM 180, thereby bypassing the printed circuit board on which MCM 180 is mounted. A signal from chip 300 sent to optoelectronic assembly 100 is converted from an electrical signal to an optical signal, after which the optical signal is communicated to an optical signaling medium (such as a fiber optic ribbon cable 175, for example) for communication to another component in the computer system. During this operation, heat generated at electronic chip 110, 150, and optoelectronic transducer 160 is transferred across transparent substrate 200 to thermal hat or heat sink 206 and away from electronic chip O/E transducer 160. As herein disclosed and discussed, it will also be appreciated that embodiments of the invention are not limited to just one or two O/E or E/O chips, but may be applied to many O/E or E/O chips and that alternate arrangements of the chips are possible from the described above.

As discussed above, the high density optoelectronic transducer, alternatively referred to as an HDOT (High Density Optical Transceiver, herein represented by numeral 100, which may be a parallel transmitter, a parallel receiver, or a combination of parallel transmitter and receiver. The companion HDOT at the other end of the link on another first level package substrate (MCM for example) performs the o/e and e/o conversions for the other processor complex (represented by electronic chip 300). In an embodiment, electronic chips 110 and 150 are an electronic chip set 210 that includes signal multiplexing and coding functions, as well as functions for driving an e/o device directly and functions for receiving a signal directly from an o/e device and for signal demultiplexing and decoding functions.

Some embodiments of the invention include some of the following advantages: the HDOT allows attachment thereof directly to a MCM without going first through a PC board mounting; the close proximity of the optoelectronic components to the electronic chip (processor for example) enables high speed data transmission, with rates at 50-100 GHz or greater; use of high speed transmission medium (copper lines on ceramic, for example) and short transmission distances (50-75 millimeters for example) between processor and optoelectronic transducer; ability to reduce the size of the optoelectronic transceiver by having a common thermal path with the other chips mounted on the MCM to the thermal spreader and/or heat sink; reduced thermal resistance for the HDOT by using the available system cooling, thereby maintaining low temperatures for improved reliability. Some embodiments also provide a path within the transparent substrate defined by metallizing a periphery of the path for an optical signaling medium, and preserve space on the printed circuit board and MCM. Mounting of the optical interface above the components and printed circuit board allows the optical cables to easily route to another MCM or to the edge of the printed circuit board for connection to another printed circuit board or MCM. Some embodiments enable common attachment processes, and standard MCM rework processes. The direct attachment of the optics to the chip carrier (MCM as an example of a first level package) enables a high bandwidth and low cost approach to optical interconnection of processor groups, and a parallel low profile arrangement of HDOTs provides for the high density packing and optimal space utilization. In particular, such 2-D planar integrated packaging provides high bandwidth interconnection between 2-D BGAs and 2-D laser arrays while maintaining 2-D thermal flow management.

Other advantages from using embodiments of the invention may be realized since the use of HDOT and fiber optics technology enables the high speed communication required between future processor complexes and allows improved packaging flexibility with its extended length capability. The bandwidth distance product capability of fiber optics allows future scaling of the bandwidth with the future processor speeds. The use of the high speed properties of HDOT and fiber optic technology, at 50-100 Giga-bits per second per line or greater, with direct first level package or MCM attachment enables the multiplexing of many parallel electrical signals into a single optical signal. This feature enables significant cost and complexity reduction by decreasing the number of signal lines between processor complexes, minimizes the need to de-skew the parallel signals, and provides inherent electromagnetic compatibility (EMC) and reduced electromagnetic interference (EMI) because the signal is optical and is not susceptible to nor does it radiate electromagnetic energy. This approach simplifies the system packaging by reducing the number of complicated electrical connectors and simplifies the system printed circuit boards and back plane boards.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention is not to be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A method of fabricating an optoelectronic assembly for communicating a signal from a system electronic chip set on an multi-chip module (MCM), the system electronic chip set adapted for at least one of data processing, data switching, and data storage, to another component in a computer system, the method comprising:

metallizing a first surface of a transparent substrate as an electrical signaling medium between a support electronic chip set and an optoelectronic transducer for electrical interconnection thereof;

wherein the support electronic chip set is configured for at least one of providing multiplexing, demultiplexing, coding, decoding and optoelectronic transducer driving and receiving functions;

bonding the support electronic chip set and optoelectronic transducer to a chip carrier;

interconnecting electrically the support electronic chip set to the optoelectronic transducer via the metallized first surface of the transparent substrate;

attaching the chip carrier to a second substrate;

attaching a heat sink to a second surface opposite said first surface of said transparent substrate, said heat sink configured with a connector receptacle configured to receive a fiber array connector therein and to allow optical communication through said first surface and said second surface and through said heat sink to said optoelectronic transducer; and bonding a fiber array disposed in the fiber array connector to the transparent substrate optically aligned with the optoelectronic transducer to provide an optical signaling medium to the optoelectronic transducer, wherein the system electronic chip set and the optoelectronic transducer share a common thermal path for cooling thereof.

2. The method of claim 1, wherein said bonding said fiber array to the transparent substrate is substantially normal with said transparent substrate.

3. The method of claim 1, flirt her comprising:

a SiC heat spreader having a first and second surface, said SiC heat spreader configured to receive said fiber array therethrough to maintain optical communication through said transparent substrate to said optoelectronic transducer, said first surface of the SiC heat spreader in thermal communication with the heat sink while said second surface of the SiC heat spreader is in thermal communication with said first surface of said transparent substrate.

* * * * *